United States Patent
Armbrecht et al.

(10) Patent No.: US 9,823,281 B2
(45) Date of Patent: Nov. 21, 2017

(54) TIME FRAME MEASURING METHOD WITH CALIBRATION IN THE FREQUENCY RANGE

(71) Applicant: ROSENBERGER HOCHFREQUENZTECHNIK GMBH & CO KG., Fridolfing (DE)

(72) Inventors: Gunnar Armbrecht, Mühldorf a Inn (DE); Christian Zietz, Hannover (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 468 days.

(21) Appl. No.: 14/387,882

(22) PCT Filed: Mar. 7, 2013

(86) PCT No.: PCT/EP2013/000675
§ 371 (c)(1),
(2) Date: Sep. 25, 2014

(87) PCT Pub. No.: WO2013/143650
PCT Pub. Date: Oct. 3, 2013

(65) Prior Publication Data
US 2015/0066408 A1    Mar. 5, 2015

(30) Foreign Application Priority Data
Mar. 28, 2012 (DE) .................. 10 2012 006 314

(51) Int. Cl.
*G01R 19/25* (2006.01)
*G01R 35/00* (2006.01)
*G01R 27/32* (2006.01)

(52) U.S. Cl.
CPC ......... *G01R 19/25* (2013.01); *G01R 19/2509* (2013.01); *G01R 27/32* (2013.01); *G01R 35/005* (2013.01)

(58) Field of Classification Search
CPC ...... G01R 35/005; G01R 27/28; G01R 27/32; G01R 35/00; G01R 19/25; H04B 3/46
(Continued)

(56) References Cited

U.S. PATENT DOCUMENTS 5,442,296 A * 8/1995 Schiek ................. G01R 35/005
324/601
5,548,538 A * 8/1996 Grace .................... G01R 35/00
324/605

(Continued)

FOREIGN PATENT DOCUMENTS

WO         03048791 A2    6/2003

OTHER PUBLICATIONS

El-Deeb et al: 11 Thru-less calibration 1-4 algorithm and measurement system for on-wafer large-signal characterisation of microwave devices 11, IET Microwaves Antennas & Propagation, vol. 4, No. 11, Nov. 18, 2010 (20HI-II-18), pp. 1773-1781, XP006036455, ISSN: 1751-8733, DOI:10.1049/IET-MAP:20090317 abstract; figures 3,2 p. 1774, right-hand column, paragraph 1-p. 1776, right-hand column, paragraph 6.

(Continued)

*Primary Examiner* — Toan Le
*Assistant Examiner* — Jeffrey Aiello
(74) *Attorney, Agent, or Firm* — DeLio, Peterson & Curcio, LLC; Robert Curcio

(57) ABSTRACT

A method for determining electric voltage u(t) and/or electric current i(t) of an RF signal in the time domain in a calibration plane, wherein by at least one directional coupler having two outputs and one signal input a first component of a first RF signal that runs from the signal input in the direction of the calibration plane, and a second component of a second RF signal that runs from the calibration plane in the direction of the signal input is decoupled. For a two-port (Continued)

error of the directional coupler, the error terms $e_{00}$, $e_{01}$, $e_{10}$ and $e_{11}$, are determined as a function of a frequency f and the signal values $v_1(t)$ and $v_2(t)$ are transformed into the frequency domain as wave quantities $V_1(f)$ and $V_2(f)$, and absolute wave quantities $a_1$ and $b_1$ in the frequency domain in the calibration plane are calculated from the wave quantities $V_1(f)$ and $V_2(f)$ by the error terms $e_{00}$, $e_{01}$, $e_{10}$ and $e_{11}$.

6 Claims, 7 Drawing Sheets

(58) Field of Classification Search
USPC ...... 324/520, 601, 638; 702/66, 76, 85, 106, 702/107
See application file for complete search history.

(56) References Cited

U.S. PATENT DOCUMENTS

| | | | | |
|---|---|---|---|---|
| 6,081,125 | A * | 6/2000 | Krekels | G01R 35/005 324/601 |
| 7,782,065 | B2 * | 8/2010 | Simon | G01R 27/28 324/601 |
| 8,340,935 | B2 * | 12/2012 | Leibfritz | G01R 27/28 702/115 |
| 2003/0115008 | A1 * | 6/2003 | Doi | G01R 1/06772 702/117 |
| 2011/0195670 | A1 * | 8/2011 | Dakshinamurthy | H01Q 3/2647 455/73 |
| 2012/0109566 | A1 * | 5/2012 | Adamian | G01R 35/005 702/107 |
| 2013/0182753 | A1 * | 7/2013 | Delforce | H04B 17/0085 375/228 |
| 2016/0209488 | A1 * | 7/2016 | Zietz | G01R 35/005 |

OTHER PUBLICATIONS

Hu J et al: "Calibrated non-linear vector network measurement without using a multi-harmonic generator", IET Microwaves Antennas & Propagation, vol. 5, No. 5, Apr. 11, 2011 (Apr. 11, 2011), pp. 616-624, XP006038342, ISSN: 1751-8733, DOI: 10.1049/IET-Map:20100580 abstract; figure 1 p. 616, left-hand column, paragraph 1-p. 621, left-hand column, last paragraph.

Ferrero A. et al.: "A Generalized Time-Domain Waveform Test-Set", Microwave Conference, 2008.EUMC 2008. 38th European, IEEE, Piscataway, NJ, USA, Oct. 27, 2008 (Oct. 27, 2008), pp. 749-752, XP031407268, ISBN: 978-2-87487-006-4 the whole document.

Abouchahine M. et al: "Broadband Time-Domain Measurement System for the Characterization of Nonlinear Microwave Devices With Memory", IEEE Transactions on Microwave Theory and Techniques, IEEE Service Center, Piscataway, NJ, US, vol. 58, No. 4, Apr. 1, 2010 (Apr. 1, 2010), pp. 1038-1045, XP011304549, ISSN: 0018-9480 abstract; figures 1-5,10 p. 1038, left-hand column, paragraph 1-p. 1041, right-hand column, paragraph 1.

Root D. et al.: X-Parameter: Das neue Paradigma zur Beschreibung nichtlinearer HF- und Mikrowellenbauelemente, TM—Technisches Messen, vol. 77, No. 7-8, 2010, XP002703955.

Barataud D. et al: 11 Measurements of Time-Domain Voltage/Current Waveforms At RF and Microwave Frequencies Based on the Use of a Vector Network Analyzer for the Characterization of Nonlinear Devices Application to High-Efficiency Power Amplifiers and Frequency-Multipliers Optimization 11 IEEE Transactions on Instrumentation and Measurement, IEEE Service Center, Piscataway, NJ, US, vol • 47, No. 5, Oct. 1, 1998 (Oct. 1, 1998), XP011024573, ISSN: 0018-9456 the whole document.

Heurermann H., Calibration of a Network Analyzer Without a Thru Connection for Nonlinear and Multiport Measurements 11, IEEE Transactions on Microwave Theory and Techniques, IEEE Service Center, Piscataway, NJ, US, vol. 56, No. 11,Nov. 1, 2008 (Nov. 1, 2008), pp. 2505-2510, XP011236944, ISSN: 0018-9480, DOI: 10.1109/ TMTT.2008.2005883 the whole document.

Siart U.; "Calibration of Network Analysers;" Jan. 4, 2012 (Version 1.51); http://www.siart.de/lehre/nwa.pdf.

Zimmer, G.; "High Frequency Technology: Linear Models" ; Springer-Verlag Berlin Heidelberg New York; 2000; ISBN 3 540 66716 4.

Hiebel, Michael: Basic Principles of Vectorial Network Analysis. 1st edition, Munich: Rohde & Schwarz GmbH & Co. KG, 2006.

* cited by examiner

TIME FRAME MEASURING METHOD WITH CALIBRATION IN THE FREQUENCY RANGE

BACKGROUND OF THE INVENTION

1. Field of the Invention

The present invention relates to a method for determining electric voltage u(t) and/or electric current i(t) of an RF signal in the time domain in a calibration plane on an electrical conductor, wherein the electrical conductor has a first port at one end and the calibration plane at an opposite end, wherein, in the calibration plane, the electrical conductor is designed such that a device under test can be connected electrically with the electrical conductor in the calibration plane, wherein a component of a first RF signal which runs on the electrical conductor from the first port in the direction of the calibration plane and a component of a second RF signal which runs on the electrical conductor from the calibration plane in the direction of the first port are coupled out by means of at least one directional coupler having two outputs, wherein a time-variable first signal value $v_1(t)$ of the component of the first RF signal is measured at a first output of the directional coupler and a time-variable second signal value $v_2(t)$ of the component of the second RF signal is measured at a second output of the directional coupler, wherein for a two-port error of the directional coupler with an error matrix E:

$$E = \begin{pmatrix} e_{00} & e_{01} \\ e_{10} & e_{11} \end{pmatrix}$$

the error terms $e_{00}$, $e_{01}$, $e_{10}$ and $e_{11}$ are determined in a first step (calibration step) as a function of a frequency f and then, in a second step (measurement step), the signal values $v_1(t)$ and $v_2(t)$ are transformed, through a first mathematical operation, into the frequency domain as wave quantities $V_1(f)$ and $V_2(f)$, wherein absolute wave quantities $a_1$ and $b_1$ in the frequency domain in the calibration plane are calculated from the wave quantities $V_1(f)$ and $V_2(f)$ by means of the error terms $e_{00}$, $e_{01}$, $e_{10}$ and $e_{11}$, wherein the calculated absolute wave quantities $a_1$ and $b_1$ are converted by means of a second mathematical operation into the electric voltage u(t) and/or the electric current i(t) of the RF signal in the time domain in the calibration plane, in accordance with the claims.

2. Description of Related Art

One of the most important measuring tasks in high frequency and microwave technology involves the measurement of reflection factors or generally—in the case of multiport devices—the measurement of scattering parameters. The network behavior of a device under test which can be described in linear terms is characterized through the scattering parameters. Frequently one is interested not only in the scattering parameters at a single measuring frequency, but in their frequency-dependency over a finitely broad measuring band. The associated measuring method is described as network analysis. Depending on the importance of the phase information in the measuring task in question, the scattering parameters can either be measured simply in terms of their value or can also be measured in complex terms; in the first case one speaks of scalar network analysis, in the second case of vectorial network analysis. Depending on the method, number of ports, and measuring frequency range, the network analyzer is a more or less complex system of test signal source and receivers which function according to the homodyne or the heterodyne principle. Because the measuring signals need to be fed to the device under test and back again through conductors and other components with unknown and sub-optimal properties, in addition to chance errors, systematic errors also occur in network analysis. These systematic errors can be minimized, within certain limits, through calibration measurements, the aim of which is to determine as many as possible of the unknown parameters of the measuring apparatus. A great number of methods and strategies exist here which differ greatly in terms of the scope of the error model used and thus in complexity and efficiency. (Uwe Siart; "Calibration of Network Analysers;" 4 Jan. 2012 (Version 1.51); http://www.siart.de/lehre/nwa.pdf)

However, scattering parameters measured with such calibration only describe linear, time-invariant devices under test completely. An extension of the scattering parameters to non-linear devices under test is represented by the X-parameters (D. Root et al: "X-parameters: The New Paradigm for Describing non-linear RF and Microwave Components." In: tm—Technisches Messen no. 7-8, Vol. 77, 2010), which are also defined through the frequency. However, each device under test is also described through measurement of the currents and voltages or the absolute wave quantities at its ports in the time domain. Measurement in the time domain inherently includes all additional spectral components caused for example through non-linearity as well as the change over time of the device under test or its input signal. Such a time domain measurement also requires calibration. However, the aforementioned calibration methods cannot be used without modification for the measurement of absolute values since they only permit the determination of relative values (scattering parameters).

Known from WO 03/048791 A2 is a high-frequency circuit analyzer which is used to test amplifier circuits. A microwave transition analyzer (MTA) with two inputs measures two independent signal waveforms on the connected amplifier circuit which is to be tested such as, for example, incident and reflected wave, in the time domain via signal paths and ports. The measured waves are subsequently processed by means of calibration data in order to compensate the influence of the measuring system on the waves between the ports of the amplifier circuit and the input ports of the MTA. The MTA, which measures signals in the time domain with attached calibration standards, is also used in order to determine the calibration data. These signals in the time domain are transformed into the frequency domain by means of an FFT and the calibration data are then determined. Since periodic signals are only measured in the time domain, the signals are transformed into low-frequency signals prior to measurement.

SUMMARY OF THE INVENTION

The invention is based on the problem of developing an improved method for measuring high-frequency currents and voltages or absolute wave quantities in the time domain.

According to the invention this problem is solved through a method of the aforementioned type with the features characterized in the claims.

The above and other objects, which will be apparent to those skilled in the art, are achieved in the present invention which is directed to a method for determining electric voltage u(t) and/or electric current i(t) of an RF signal in the time domain in a calibration plane on an electrical conductor, said calibration plane having a device under test connected electrically in the calibration plane, wherein, via at least one directional coupler having two outputs and one signal input, a component of a first RF signal which runs within the at least one directional coupler from its signal input in the direction of the calibration plane and a component of a second RF signal which runs within the at least one directional coupler from the calibration plane in the direction of the signal input are coupled out, wherein a time-variable first signal value $v_1(t)$ of the component of the first RF signal is measured at a first output of the at least one directional coupler and a time-variable second signal value $v_2(t)$ of the component of the second RF signal is measured at a second output of the at least one directional coupler, wherein the at least one directional coupler is connected at its signal input with an input cable, said input cable having at its other end a first port, wherein, for a two-port error of the at least one directional coupler with an error matrix E $$E = \begin{pmatrix} e_{00} & e_{01} \\ e_{10} & e_{11} \end{pmatrix}$$

the error terms $e_{00}$, $e_{01}$, $e_{10}$ and $e_{11}$ are determined in a first step (calibration step) as a function of a frequency f and then, in a second step (measurement step), the time-variable first signal value $v_1(t)$ and the time-variable second signal value $v_2(t)$ are transformed, through a first mathematical operation, into the frequency domain as wave quantities $V_1(f)$ and $V_2(f)$, wherein absolute wave quantities $a_1$ and $b_1$ in the frequency domain in the calibration plane are calculated from the wave quantities $V_1(f)$ and $V_2(f)$ by means of the error terms $e_{00}$, $e_{01}$, $e_{10}$ and $e_{11}$, wherein the calculated absolute wave quantities $a_1$ and $b_1$ are converted by a second mathematical operation into the electric voltage $u(t)$, the electric current $i(t)$, or both, of the RF signal in the time domain in the calibration plane, such that, in order to determine the error terms $e_{00}$, $e_{01}$, $e_{10}$ and $e_{11}$, the first port (12), the signal input of the at least one directional coupler together with input cable, the first output of the at least one directional coupler and the second output of the at least one directional coupler are each electrically connected with a calibration device and, in order to measure the time-variable first signal value $v_1(t)$ and the time-variable second signal value $v_2(t)$, the signal input, the first output of the at least one directional coupler and the second output of the at least one directional coupler are isolated from the calibration device and electrically connected with a time domain measuring device, wherein a VNA (Vectorial Network Analyzer) with a first VNA port, a second VNA port and a third VNA port is used as calibration device, wherein a wave quantity $a_2$ of the component of the first RF signal coupled out via the first output of the at least one directional coupler is measured at the second VNA port electrically connected with the first output, and a wave quantity $b_2$ of the component of the second RF signal coupled out via the second output of the at least one directional coupler is measured at the third VNA port of the network analyzer electrically connected with the second output, wherein, for a two-port error between the first port of the input cable, which is connected with the first port of the VNA, and the calibration plane, with an error matrix I $$I = \begin{pmatrix} i_{00} & i_{01} \\ i_{10} & i_{11} \end{pmatrix}$$

the error terms $i_{00}$, $i_{01}$, $i_{10}$ and $i_{11}$ are determined and the error terms $e_{00}$, $e_{01}$, $e_{10}$ and $e_{11}$ are determined from these, whereby the error terms $e_{00}$, $e_{01}$, $e_{10}$ and $e_{11}$ and the error terms $i_{00}$, $i_{01}$, $i_{10}$ and $i_{11}$ are calculated from scattering parameters $S_{11,K}$, $S_{21,K}$, and $S_{31,K}/S_{21,K}$ of a scattering matrix S for the first port of the electric input cable leading to the signal input of the at least one directional coupler, the first output of the at least one directional coupler and the second output of the at least one directional coupler and a calibration standard K in each case electrically connected to the calibration plane, where K is represents a calibration standard of the type O (Open), S (Short), or M (Match), according to the formulas:

$$i_{00} = S_{11,M},$$

$$e_{00} = \frac{s_{31,M}}{s_{21,M}},$$

$$i_{10} \cdot i_{01} = \frac{(\Gamma_O - \Gamma_S)(S_{11,O} - S_{11,M})(S_{11,S} - S_{11,M})}{\Gamma_O \Gamma_S (S_{11,O} - S_{11,S})}$$

$$e_{10} \cdot e_{01} = \frac{(\Gamma_O - \Gamma_S)\left(\frac{S_{31,O}}{S_{21,O}} - \frac{S_{31,M}}{S_{21,M}}\right)\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)}$$

$$i_{11} = \frac{\Gamma_S(S_{11,O} - S_{11,M}) - \Gamma_O(S_{11,S} - S_{11,M})}{\Gamma_O \Gamma_S (S_{11,O} - S_{11,O})}$$

$$e_{11} = \frac{\Gamma_S\left(\frac{S_{31,O}}{S_{21,O}} - \frac{S_{31,M}}{S_{21,M}}\right) - \Gamma_O\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)}$$

where $\Gamma_O$ is a known reflection factor of the Open calibration standard and $\Gamma_S$ is a known reflection factor of the Short calibration standard, whereby the scattering parameters $S_{11,K}$, $S_{21,K}$, and $S_{31,K}/S_{21,K}$ are determined, according to the formulas $$S_{11,K} = \frac{b_0}{a_0}$$

$$S_{21,K} = \frac{a_2}{a_0}$$

$$\frac{S_{31,K}}{S_{21,K}} = \frac{b_2}{a_2}$$

from measurements, carried out with the VNA, of a wave quantity $a_0$ of the first RF signal at the first port, a wave quantity $b_0$ of the second RF signal at the first port, the wave quantity $a_2$ of the component of the first RF signal at the first output of the at least one directional coupler and the wave quantity $b_2$ of the component of the second RF signal at the second output of the at least one directional coupler, wherein in each case the calibration standard K is electrically connected to the calibration plane, wherein the wave quantities $a_1$ and $b_1$ are determined according to the following formulas $$a_1 = \frac{e_{10} a_2}{1 - e_{11} \Gamma_{DUT}}$$

$$b_1 = \frac{b_2 - e_{00} a_2}{e_{01}}$$

-continued where $$a_2 = \frac{V_1}{\sqrt{Z_t}}$$

$$b_2 = \frac{V_2}{\sqrt{Z_1}}$$

$$\Gamma_{DUT} = \frac{\frac{b_2}{a_2} - e_{00}}{e_{10} \cdot e_{01} + e_{11}\left(\frac{b_2}{a_2} - e_{00}\right)}.$$

$$e_{10} = i_{10} \cdot \frac{a_0}{a_2} \cdot \frac{1 - e_{11}\Gamma_{DUT}}{1 - i_{11}\Gamma_{DUT}}$$

where $\Gamma_{DUT}$ is the reflection factor of the device under test (DUT) connected to the calibration plane and $Z_1$ is the impedance at the first and second output of the at least one directional coupler.

The first mathematical operation of the method is an FFT (Fast Fourier Transform) according to $$\{V_1(l \cdot \Delta f)\} = FFT\{v_1(k \cdot \Delta t)\}$$

$$\{V_2(l \cdot \Delta f)\} = FFT\{v_2(k \cdot \Delta t)\}$$

with k=0, 1, . . . , N−1
and l=0, 1, . . . , (N−1)/2 where N is a number of data points, $\Delta f$ is a frequency increment expressed by $\Delta f = 2f_{max}/(N-1)$, $\Delta t$ is a time increment expressed by $\Delta t = 0.5/f_{max}$, and $f_{max}$ represents the maximum frequency for which calibration data are available, wherein the second mathematical operation is an inverse FFT (IFFT—Inverse Fast Fourier Transform) according to $$\{u(k \cdot \Delta t)\} = IFFT\{\sqrt{Z_0}(a_1(l \cdot \Delta f) + b_1(l \cdot \Delta f))\},$$

$$\{i(k \cdot \Delta t)\} = IFFT\{(\sqrt{Z_0})^{-1}(a_1(l \cdot \Delta f) - b_1(l \cdot \Delta f))\}.$$

where $Z_0$ is an impedance in the calibration plane.

An oscilloscope may be used as time domain measuring device

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
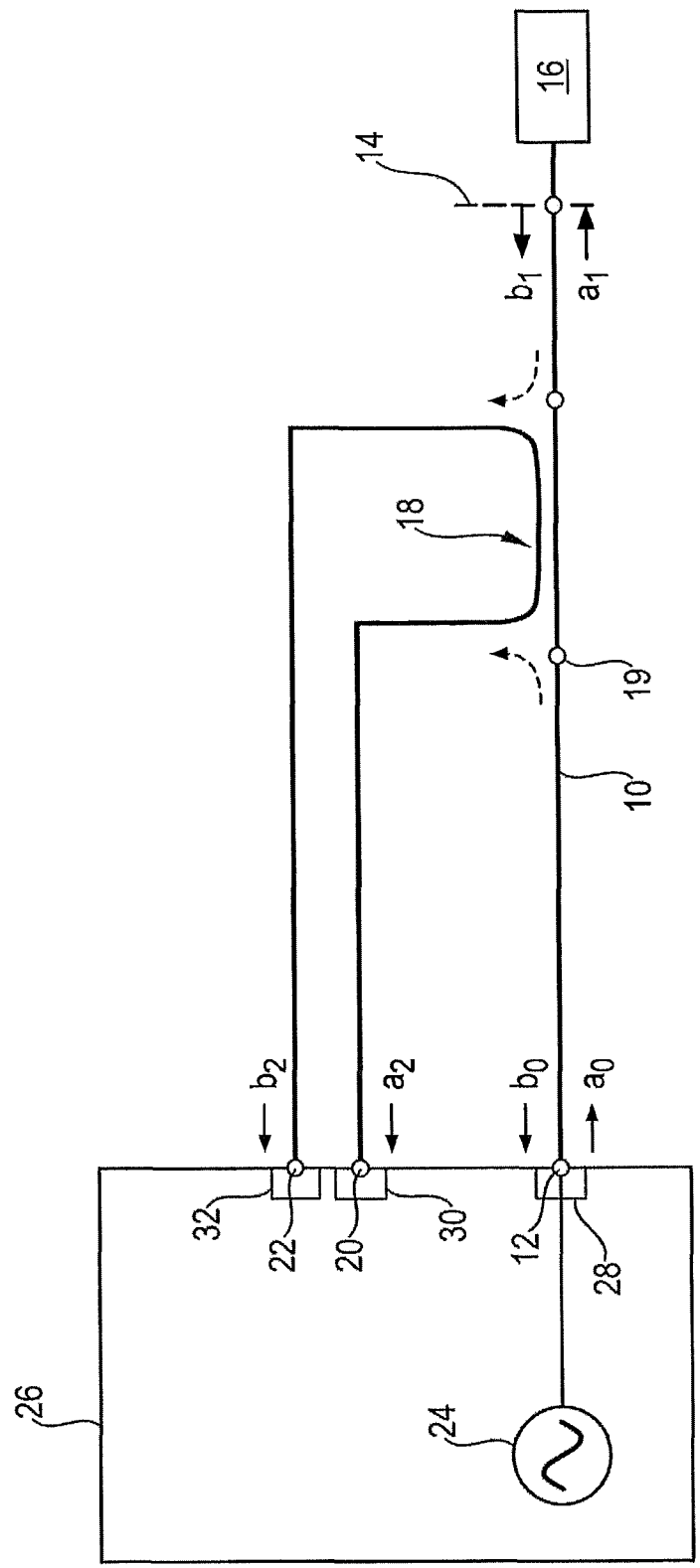
FIG. 1 shows a schematic representation of a measuring set-up for performing a calibration step in the frequency domain according to the invented method.

In describing the preferred embodiment of the present invention, reference will be made herein to FIGS. 1-10 of the drawings in which like numerals refer to like features of the invention.

According to the invention, in a method of the aforementioned type, in order to determine the error terms $e_{00}$, $e_{01}$, $e_{10}$ and $e_{11}$, the first port, the signal input of the directional coupler together with input cable, the first output of the directional coupler and the second output of the directional coupler are each electrically connected with a calibration device and, in order to measure the time-variable first signal value $v_1(t)$ and the time-variable second signal value $v_2(t)$, the signal input, the first output of the directional coupler and the second output of the directional coupler are isolated from the calibration device and electrically connected with a time domain measuring device, wherein a VNA (Vectorial Network Analyzer) with a first VNA port, a second VNA port and a third VNA port is used as calibration device, wherein a wave quantity $a_2$ of the component of the first RF signal coupled out via the first output of the directional coupler is measured at the second VNA port electrically connected with the first output, and a wave quantity $b_2$ of the component of the second RF signal coupled out via the second output of the directional coupler is measured at the third VNA port of the network analyzer electrically connected with the second output, wherein for a two-port error between the first port of the input cable, which is connected with the first port of the VNA, and the calibration plane, with an error matrix I:

$$I = \begin{pmatrix} i_{00} & i_{01} \\ i_{10} & i_{11} \end{pmatrix}$$

the error terms $i_{00}$, $i_{01}$, $i_{10}$ and $i_{11}$ are determined and the error terms $e_{00}$, $e_{01}$, $e_{10}$ and $e_{11}$ are determined from these, whereby the error terms $e_{00}$, $e_{01}$, $e_{10}$ and $e_{11}$ and the error terms $i_{00}$, $i_{01}$, $i_{10}$ and $i_{11}$ are calculated from scattering parameters $S_{11,K}$, $S_{21,K}$, and $S_{31,K}/S_{21,K}$ of a scattering matrix S for the first port of the electric input cable leading to the signal input of the directional coupler, the first output of the directional coupler and the second output of the directional coupler and a calibration standard K in each case electrically connected to the calibration plane, where K is equal to O, S or M and stands, respectively, for a calibration standard of the type O (Open), S (Short) or M (Match), according to the formulas $$i_{00} = S_{11,M}, \tag{4}$$

$$e_{00} = \frac{S_{31,M}}{S_{21,M}}, \tag{5}$$

$$i_{10} \cdot i_{01} = \frac{(\Gamma_O - \Gamma_S)(S_{11,O} - S_{11,M})(S_{11,S} - S_{11,M})}{\Gamma_O \Gamma_S (S_{11,O} - S_{11,S})} \tag{6}$$

$$e_{10} \cdot e_{01} = \frac{(\Gamma_O - \Gamma_S)\left(\frac{S_{31,O}}{S_{21,O}} - \frac{S_{31,M}}{S_{21,M}}\right)\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)} \tag{7}$$

$$i_{11} = \frac{\Gamma_S(S_{11,O} - S_{11,M}) - \Gamma_O(S_{11,S} - S_{11,M})}{\Gamma_O \Gamma_S (S_{11,O} - S_{11,O})} \tag{8}$$

$$e_{11} = \frac{\Gamma_S\left(\frac{S_{31,O}}{S_{21,O}} - \frac{S_{31,M}}{S_{21,M}}\right) - \Gamma_O\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)} \tag{9}$$

where $\Gamma_O$ is a known reflection factor of the Open calibration standard and $\Gamma_S$ is a known reflection factor of the Short calibration standard, whereby the scattering parameters $S_{11,K}$, $S_{21,K}$, and $S_{31,K}/S_{21,K}$ are determined, according to the formulas:

$$S_{11,K} = \frac{b_0}{a_0} \tag{1}$$

$$S_{21,K} = \frac{a_2}{a_0} \tag{2}$$

$$\frac{S_{31,K}}{S_{21,K}} = \frac{b_2}{a_2} \tag{3}$$

from measurements, carried out with the VNA (26), of a wave quantity $a_0$ of the first RF signal at the first port (12), a wave quantity $b_0$ of the second RF signal at the first port (12), the wave quantity $a_2$ of the component of the first RF signal at the first output (20) of the directional coupler (18) and the wave quantity $b_2$ of the component of the second RF signal at the second output (22) of the directional coupler (18), wherein in each case the calibration standard K (16) is electrically connected to the calibration plane (14), wherein the wave quantities $a_1$ and $b_1$ are determined according to the following formulas $$a_1 = \frac{e_{10} a_2}{1 - e_{11} \Gamma_{DUT}} \tag{13}$$

$$b_1 = \frac{b_2 - e_{00} a_2}{e_{01}} \tag{15}$$

where $$a_2 = \frac{V_1}{\sqrt{Z_t}} \tag{18}$$

$$b_2 = \frac{V_2}{\sqrt{Z_1}} \tag{19}$$

$$\Gamma_{DUT} = \frac{\frac{b_2}{a_2} - e_{00}}{e_{10} \cdot e_{01} + e_{11}\left(\frac{b_2}{a_2} - e_{00}\right)}. \tag{10}$$

$$e_{10} = i_{10} \cdot \frac{a_0}{a_2} \cdot \frac{1 - e_{11}\Gamma_{DUT}}{1 - i_{11}\Gamma_{DUT}} \tag{14}$$

where $\Gamma_{DUT}$ is the reflection factor of the device under test (16) (DUT) connected to the calibration plane (14) and $Z_1$ is an impedance at the first and second output (20, 22) of the directional coupler (18).

This has the advantage that a calibrated measurement of electric voltages and currents in the time domain is available, so that the phasing of all spectral components is automatically maintained in the output signal. Nonetheless, the calibration can be carried out with mono frequency signals in the frequency domain. A particularly high-resolution measuring method with a wide dynamic range is achieved, whereby a particularly simple, rapid and precise calibration is possible. An unequivocal separate determination of all error terms $e_{00}$, $e_{01}$, $e_{10}$ and $e_{11}$ is also possible.

A particularly simple measuring set-up using economical electronic components is achieved in that the signal values $v_1(t)$ and $v_2(t)$ are, respectively, an electric voltage or an electric current.

A particularly rapid and at the same time precise transformation between the frequency domain and time domain which can be carried out without complex calculation is achieved in that the first mathematical operation is an FFT (Fast Fourier Transform) according to:

$$\{V_1(l \cdot \Delta f)\} = \text{FFT}\{v_1(k \cdot \Delta t)\} \tag{16}$$

$$\{V_2(l \cdot \Delta f)\} = \text{FFT}\{v_2(k \cdot \Delta t)\} \tag{17}$$

with k=0, 1, . . . , N−1
and l=0, 1, . . . , (N−1)/2
where N is a number of data points, $\Delta f$ is a frequency increment $\{\Delta f = 2f_{max}/(N-1)\}$, $\Delta t$ is a time increment $\{\Delta t = 0.5/f_{max}\}$, and $f_{max}$ represents the maximum frequency for which calibration data are available, wherein the second mathematical operation is an inverse FFT (IFFT—Inverse Fast Fourier Transform) according to:

$$\{u(k \cdot \Delta t)\} = \text{IFFT}\{\sqrt{Z_0}(a_1(l \cdot \Delta f) + b_1(l \cdot \Delta f))\}, \tag{20}$$

$$\{i(k \cdot \Delta t)\} = \text{IFFT}\{(\sqrt{Z_0})^{-1}(a_1(l \cdot \Delta f) - b_1(l \cdot \Delta f))\}. \tag{21}$$

where $Z_0$ is an impedance in the calibration plane.

A particularly simple and functionally reliable measuring set-up is achieved in that an oscilloscope, which can be used for quantization of the signal in terms of time and value range, for example a digital oscilloscope, is used as time domain measuring device.

Accordingly, the invention suggests a calibration method which exploits the fact that the pure calibration is linear and time-invariant and can thus be performed in the frequency domain. This makes it possible to utilize the highly dynamic properties of a vectorial network analyzer.

FIG. 1 shows, in schematic form, an arrangement for carrying out the method according to the invention. This arrangement features a directional coupler 18 with a signal input 19 which is connected with a port 12 via an input cable 10. The other end of the directional coupler is provided with a calibration plane 14. The calibration plane 14 is designed such that a device under test (DUT) 16 can be electrically connected to the calibration plane 14. This DUT 16 is for example a calibration standard or an electronic circuit or an electronic component which is to be tested. A component of a first RF signal which runs within the directional coupler 18 from the signal input 19 in the direction of the calibration plane 14 and a component of a second RF signal which runs within the directional coupler 18 from the calibration plane 14 in the direction of the signal input 19 is coupled out by means of the directional coupler 18 with two outputs 20, 22. Suitable as a directional coupler 18 is any component which possesses directivity, i.e. which allows a distinction between the component of the first RF signal and the component of the second RF signal. A signal is fed into the first port 12 of the input cable 10 by means of a signal generator 24.

FIG. 1 shows, in schematic form, a measuring set-up for performing a calibration of the arrangement consisting of an input cable 10 between the port 12 and the signal input 19, a directional coupler 18 and outputs 20, 22, with a vectorial network analyzer (VNA) 26 equipped with a first VNA port 28, a second VNA port 30 and a third VNA port 32. The following wave quantities are thereby introduced: $a_0$ and $b_0$ denote the waves at the feeding first port 12 of the input cable 10, which is electrically connected with a corresponding first port of the network analyzer 26. $a_1$ and $b_1$ denote the wave quantities in the calibration plane 14. The wave quantities $a_2$ and $b_2$ are values coupled out via the directional coupler 18 which are measured at the second VNA port 30 and the third VNA port 32 of the network analyzer 26, which are electrically connected with the first output 20 and the second output 22 of the directional coupler 18. It is assumed here that these ports 30, 32 are ideally matched, i.e. that no reflection of these waves occurs. During the course of calibration, the relationship between $a_1$, $b_1$ and the values $a_2$, $b_2$ are to be determined. The VNA 26 is already calibrated at its ports 28, 30, 32, for example using the UOSM method (Unknown, Open, Short, Match, also known as SOLR). In this way, the relationships between the wave quantities can be measured directly as scattering parameters, in particular:

$$S_{11} = \frac{b_0}{a_0}, \quad (1)$$

$$S_{21} = \frac{a_2}{a_0}, \quad (2)$$

$$\frac{S_{31}}{S_{21}} = \frac{b_2}{a_2}. \quad (3)$$

Measurements of the aforementioned scattering parameters are now carried out over the desired frequency range, while three different calibration standards 16 (OSM: Open, Short, Match) as DUT (Device Under Test) provide known reflection factors $\Gamma_{DUT}$ in the calibration plane.

Figure 3:
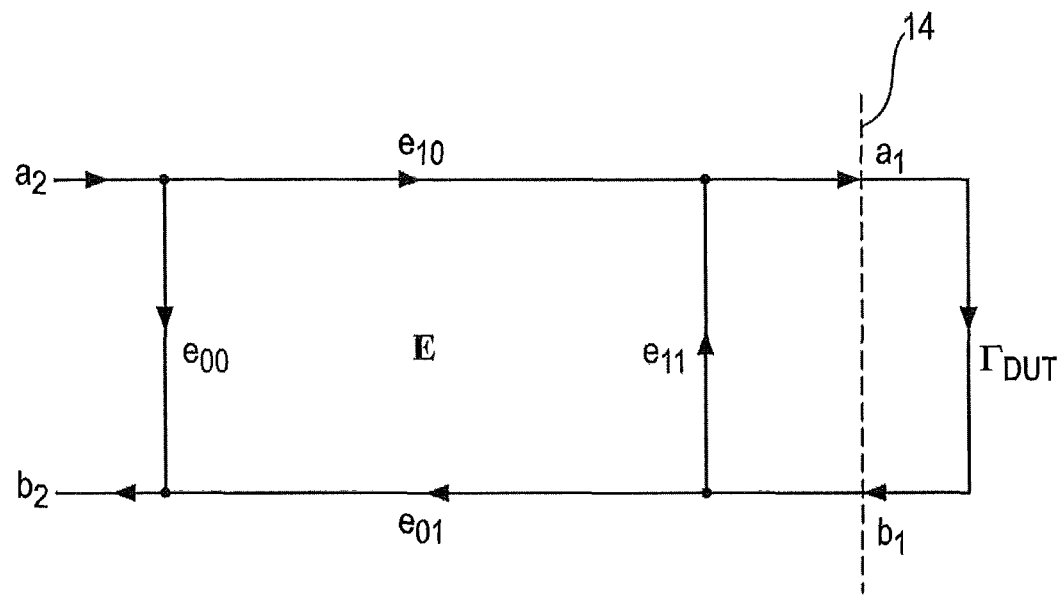
FIG. 3 shows a signal flow diagram for a two-port error with the error matrix E between outputs of a directional coupler and a calibration plane of an electrical conductor for the measuring set-up according to FIG. 1.

The properties of the directional coupler 18 are considered as a two-port error which is arranged between the device under test (DUT) 16 or the calibration plane 14 and the then ideal directional coupler 18. FIG. 3 shows the corresponding signal flow diagram for this two-port error.

Figure 2:
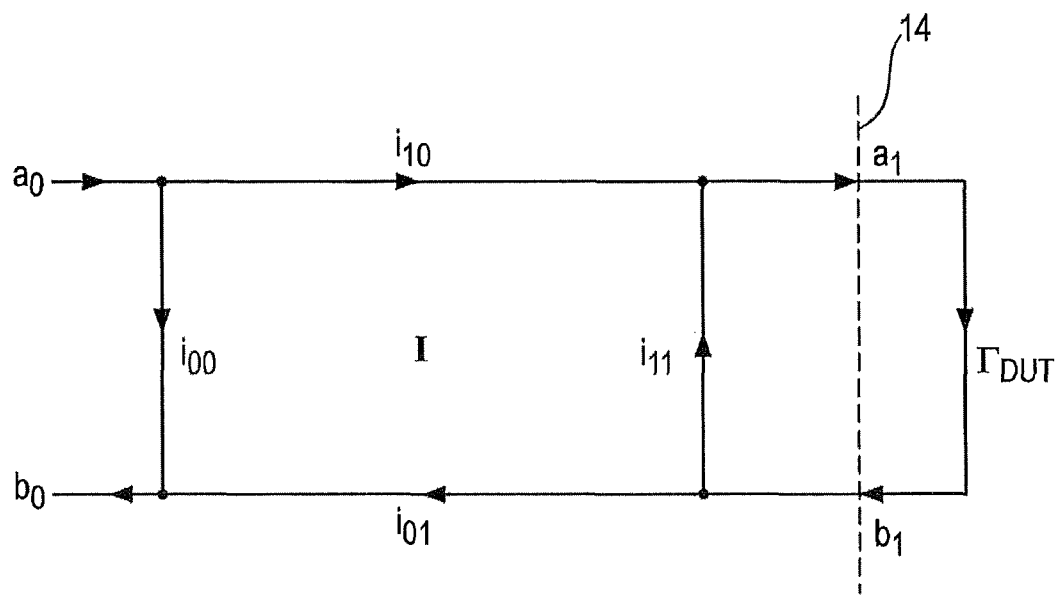
FIG. 2 shows a signal flow diagram for a two-port error with the error matrix I between a first port and a calibration plane of an electrical conductor for the measuring set-up according to FIG. 1.

FIG. 2 shows the corresponding signal flow diagram for the second two-port error of the arrangement represented in FIG. 1 between the port 12 of the input cable 10 and the calibration plane 14. During the course of a calibration, the individual error parameters are determined and used for mathematical correction of the measured values. The two-port error according to FIG. 3 with the error matrix E represents a two-port network connected between the actual device under test and the measuring result with the four independent parameters $e_{00}$, $e_{01}$, $e_{10}$ and $e_{11}$, where these are complex parameters which are frequency-dependent. These four parameters of the two-port error must therefore be determined for each desired frequency value. This requires at least three independent measurements carried out on so-called calibration standards 16. A frequently used calibration method is the so-called OSL calibration (Open, Short, Load). The calculation of the complex parameters $e_{00}$, $e_{01}$, $e_{10}$ and $e_{11}$ from the calibration measurements is for example described in "High Frequency Technology: Linear Models" by G Zimmer; Springer-Verlag Berlin Heidelberg New York; 2000; ISBN 3 540 66716 4. These three parameters already allow the reflection factors of an unknown DUT to be determined, but do not allow the determination of absolute wave quantities in accordance with the invention. In order to break down the product $e_{10}e_{01}$ into its factors $e_{10}$, $e_{01}$, one therefore proceeds as described in the following section.

The measuring set-up according to FIG. 1 can therefore be divided into two independent two-port errors. FIG. 2 shows a signal flow diagram of a first two-port error with an error matrix I:

$$I = \begin{pmatrix} i_{00} & i_{01} \\ i_{10} & i_{11} \end{pmatrix},$$

between the first port 12 of the electric signal line 10 or the first VNA port 28 of the network analyzer 26 on the one hand and the DUT 16 on the other hand. FIG. 3 shows a signal flow diagram of a second two-port error with the error matrix E:

$$E = \begin{pmatrix} e_{00} & e_{01} \\ e_{10} & e_{11} \end{pmatrix},$$

which results from a four-port-two-port reduction (as described, for example, in HIEBEL, Michael: Basic Principles of Vectorial Network Analysis. 1st edition, Munich: Rohde & Schwarz GmbH & Co. KG, 2006) between the second and third port 30, 32 of the VNA 26 or the first and second output 20, 22 of the directional coupler 18 on the one hand and the DUT 16 on the other hand. The final aim of calibration is the determination of all four components $e_{00}$, $e_{01}$, $e_{10}$ and $e_{11}$ of the error matrix E, since only then can the absolute wave quantity as well as the current and voltage be determined. Measurement with OSM calibration standards (OSM=Open; Short; Match) makes it possible to determine $(e;i)_{00}$, $(e;i)_{11}$ and $(e;i)_{10}$, $(e;i)_{01}$ separately for each frequency point. If one denotes the reflection factors of the standards Open, Short and Match as $\Gamma_O$, $\Gamma_S$ and $\Gamma_M$ and assumes that $\Gamma_M=0$ (ideal match), then (according to HIEBEL, Michael: Basic Principles of Vectorial Network Analysis. 1st edition, Munich: Rohde & Schwarz GmbH & Co. KG, 2006), using (1) to (3) one obtains:

$$i_{00} = S_{11,M}, \tag{4}$$

$$e_{00} = \frac{S_{31,M}}{S_{21,M}}, \tag{5}$$

$$i_{10} \cdot i_{01} = \frac{(\Gamma_O - \Gamma_S)(S_{11,O} - S_{11,M})(S_{11,S} - S_{11,M})}{\Gamma_O \Gamma_S (S_{11,O} - S_{11,S})} \tag{6}$$

$$e_{10} \cdot e_{01} = \frac{(\Gamma_O - \Gamma_S)\left(\frac{S_{31,O}}{S_{21,O}} - \frac{S_{31,M}}{S_{21,M}}\right)\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)} \tag{7}$$

$$i_{11} = \frac{\Gamma_S(S_{11,O} - S_{11,M}) - \Gamma_O(S_{11,S} - S_{11,M})}{\Gamma_O \Gamma_S (S_{11,O} - S_{11,S})} \tag{8}$$

$$e_{11} = \frac{\Gamma_S\left(\frac{S_{31,O}}{S_{21,O}} - \frac{S_{31,M}}{S_{21,M}}\right) - \Gamma_O\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)} \tag{9}$$

where $S_{x,y,z}$ denotes the measurement of the scattering parameter S with x=1, 2 or 3 and y=1 with the standard Z with Z=O (Open), M (Match) or S (Short). The knowledge of these terms is sufficient in order to determine the reflection factor of a DUT 16 in the calibration plane $\Gamma_{DUT}=b_1/a_1$ from the relationship between the measured wave quantities $b_2/a_2$ (see (3)). The following applies for this purpose:

$$\Gamma_{DUT} = \frac{\frac{b_2}{a_2} - e_{00}}{e_{10} \cdot e_{01} + e_{11}\left(\frac{b_2}{a_2} - e_{00}\right)}. \tag{10}$$

However, in order to determine the absolute wave quantities $a_1$ and $b_1$ from $a_2$ and $b_2$ it is necessary to break down the product $e_{10}e_{01}$ into its factors. To do so, $i_{10} \cdot i_{01}$ is first decomposed. It is hereby possible to exploit the fact that the error matrix I describes the relationship between the first VNA port 28 of the VNA 26 and the calibration plane 14, and thus a reciprocal two-port, i.e., $$i_{10} = i_{01} = \pm\sqrt{i_{10} \cdot i_{01}}. \tag{11}$$

The decision as to the correct sign in (11) is equivalent to the correct determination of the phase of $i_{10}$ from two possibilities. To do so one proceeds as follows: the phase at a frequency point must be adequately precisely known in order to make the decision as to the correct sign. This can for example be achieved through an estimation of the electrical length of the set-up between the first VNA port 28 of the VNA 26 and the calibration plane 14.

It is also assumed that the phase changes by less than 90° between two adjacent frequency points. This means that the correct phase of $i_{10}$ can also be determined for all frequency points. The following relationships for $a_1$ can be derived from the signal flow diagrams in FIGS. 2 and 3:

$$a_1 = \frac{i_{10} a_0}{1 - i_{11}\Gamma_{DUT}} \tag{12}$$

$$a_1 = \frac{e_{10} a_2}{1 - e_{11}\Gamma_{DUT}} \tag{13}$$

Since both equations described the same wave quantity, one obtains from these $$e_{10} = i_0 \cdot \frac{a_0}{a_2} \cdot \frac{i - e_{11}\Gamma_{DUT}}{1 - i_{11}\Gamma_{DUT}} \tag{14}$$

where $$\frac{a_0}{a_2} = S_{21}^{-1},$$

so that $e_{10}$ and, derived from this using (7), also $e_{01}$ can be determined individually. Using (10), (13) and the relationship $$b_1 = \frac{b_2 - e_{00} a_2}{e_{01}} \tag{15}$$

which can also be derived from the signal flow graphs according to FIG. 3, following determination of the four coefficients of the matrix E from measured $a_2$ and $b_2$, the absolute wave quantities $a_1$ and $b_1$ in the calibration plane 14 can now be determined.

Figure 4:
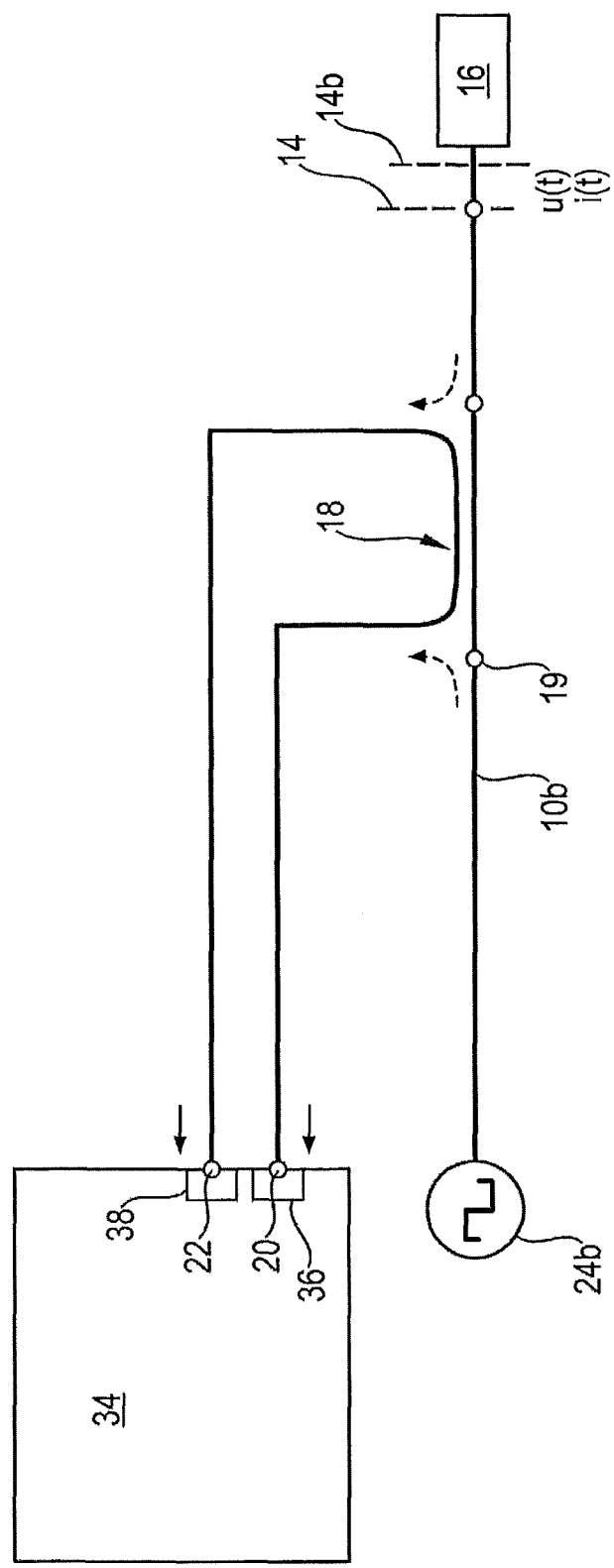
FIG. 4 shows a schematic representation of a measuring set-up for performing a measurement step in the time domain according to the invented method.
Figure 5:
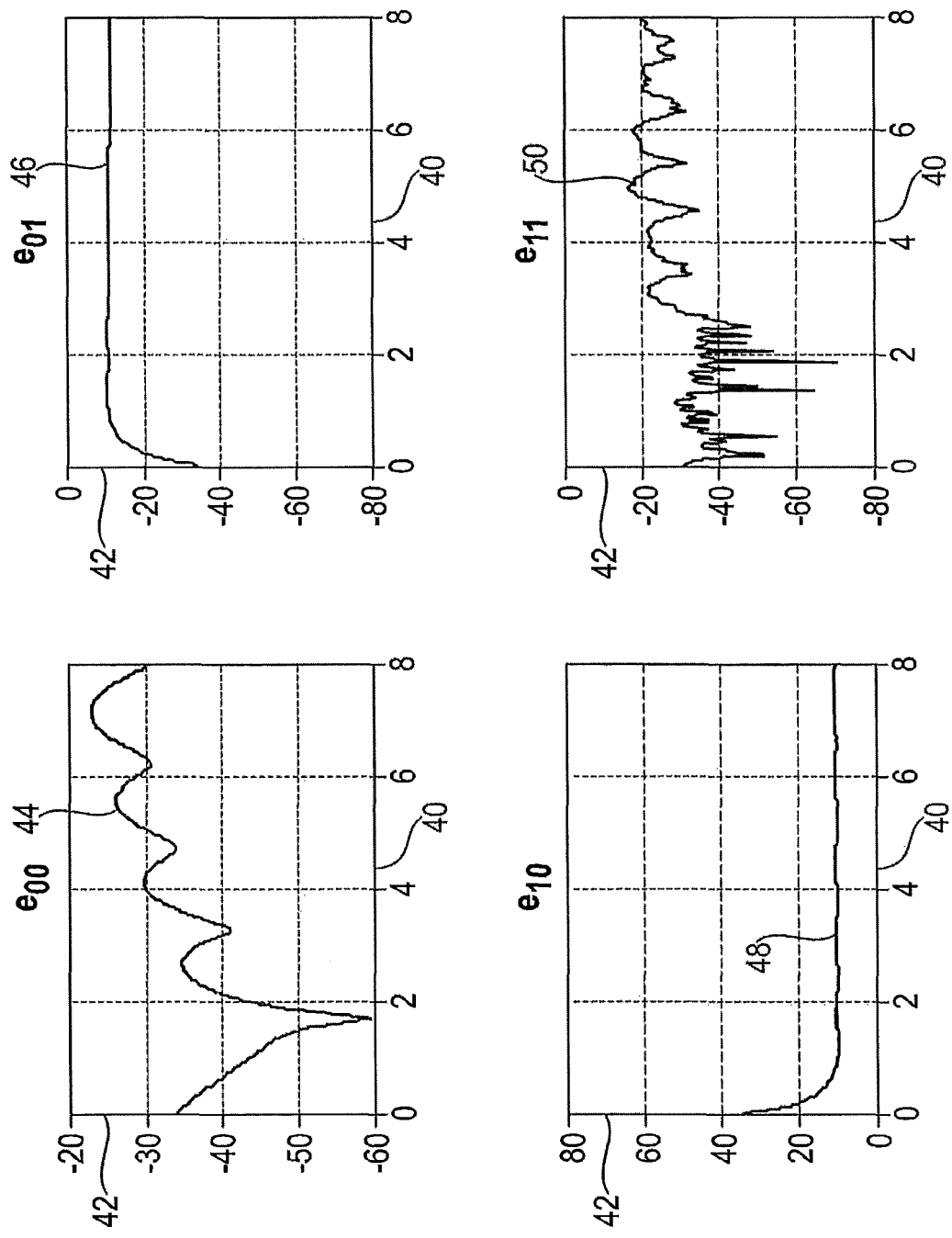
FIG. 5 shows a graphic representation of error coefficients $e_{00}$, $e_{01}$, $e_{10}$ and $e_{11}$ of the error matrix E as a function of a frequency f, determined by way of example in the calibration step of the method according to the invention.

FIG. 4 shows the set-up for the measurement of current i(t) and voltage u(t) in the previously defined calibration plane 14 in the time domain, wherein parts with the same function are identified with the same reference numbers as in FIGS. 1 and 3, so that they are explained with reference to the description of FIGS. 1 and 3 above. An oscilloscope 34 is hereby electrically connected with the outputs 20 and 22 of the directional coupler 18 and any desired signal source 24b is connected with the signal input 19 via a possibly modified input cable 10b.

Since, as a result of the measurement in the time domain, the phase information is inherently maintained between all spectral components, this set-up is not limited to the measurement of mono frequency or periodic signals. The outputs 20, 22 of the directional coupler 18 are connected with two input channels of the oscilloscope 34 identified as $v_1$ 36 or $v_2$ 38. It is assumed that the set-up between the calibration plane 14 and the inputs 36, 38 of the oscilloscope 23 or the outputs 20, 22 of the directional coupler 18 does not change in comparison with the calibration according to FIG. 1, so that the calibration coefficients which have been determined remain valid. On the other hand, changes to the signal source 24b and its input cable 10b to the coupler have no influence on the calibration.

The measured voltages are represented—if necessary through interpolation—as time-discrete vectors $\{v_1(k \cdot \Delta t)\}$ or $\{v_2(k \cdot \Delta t)\}$ with a time increment $\Delta t = 0.5/f_{max}$, where $f_{max}$ denotes the maximum frequency for which calibration data are available and k=0, 1, . . . , N−1 a continuous index over all N data points. These vectors are transformed into the frequency domain with the aid of the fast Fourier transform (FFT) and are then referred to as $V_1$ and $V_2$:

$$\{V_1(l \cdot \Delta f)\} = \text{FFT}\{v_1(k \cdot \Delta t)\} \tag{16}$$

$$\{V_2(l \cdot \Delta f)\} = \text{FFT}\{v_2(k \cdot \Delta t)\} \tag{17}$$

with k=0, 1, . . . , N−1
and l=0, 1, . . . , (N−1)/2.

Since the measured voltages are real values, it is sufficient to consider the spectral components for f≥0. The result is a frequency increment $\Delta f = 2 f_{max}/(N-1)$. The calibration coefficients $e_{xy}$ are brought into the same frequency grid through interpolation. If one assumes that the inputs of the oscilloscope 34 have the same impedance $Z_1$ as their input cable, so that no reflections occur at this point, then the corresponding wave quantities for each frequency point are determined as:

$$a_2 = \frac{V_1}{\sqrt{Z_1}} \quad (18)$$

$$b_2 = \frac{V_2}{\sqrt{Z_1}} \quad (19)$$

The absolute wave quantities $a_1$ and $b_1$ in the calibration plane 14 are determined from these wave quantities with the aid of (10), (13) and (15). Through de-embedding, i.e., if one knows the scattering parameters of the elements between the calibration plane 14 and a further plane 14b, it is also possible to shift the plane in relation to which the absolute wave quantities $a_1$ and $b_1$ are determined from the original calibration plane 14 to the plane 14b. (Michael Hiebel: *Basic Principles of Vectorial Network Analysis*, 1st edition, Munich: Rohde & Schwarz GmbH & Co. KG, 2006). Using inverse FFT, the time-discrete representation of the voltage u(t) and of the current i(t) in the calibration plane 14 or the plane 14b shifted through de-embedding can be obtained from this, whereby in this case the fact that these are real values is exploited:

$$\{u(k \cdot \Delta t)\} = \text{IFFT}\{\sqrt{Z_0}(a_1(l \cdot \Delta f) + b_1(l \cdot \Delta f))\}, \quad (20)$$

$$\{i(k \cdot \Delta t)\} = \text{IFFT}\{(\sqrt{Z_0})^{-1}(a_1(l \cdot \Delta f) - b_1(l \cdot \Delta f))\}. \quad (21)$$

The calibration and measurement method according to the invention explained above is verified in the following with reference to measurements. A set-up consisting of two Krytar Model 1821 −10 dB directional couplers is used as coupler. Their specified frequency range extends from 1 to 18 GHz. A coupler with high frequency-dependent coupling attenuation can thus be emulated through measurements at lower frequencies. A Rohde & Schwarz ZVA8 network analyzer is used for calibration. Calibration data are obtained for the frequency range 300 kHz to 8 GHz. The obtained coefficients of the error matrix E are represented graphically in FIG. 5, wherein in each case a frequency f in GHz is entered on a horizontal axis 40 and values for the coefficient $e_{xy}$ in dB are entered on a vertical axis 42. A first graph 44 illustrates the curve of the values for the coefficient $e_{00}$ as a function of the frequency f, a second graph 46 illustrates the curve of the values for the coefficient $e_{01}$ as a function of the frequency f, a third graph 48 illustrates the curve of the values for the coefficient $e_{10}$ as a function of the frequency f and a fourth graph 50 illustrates the curve of the values for the coefficient $e_{11}$ as a function of the frequency f.

The coefficients $e_{01}$ and $e_{10}$ are substantially determined through the coupling attenuation of the directional coupler. This has, for example at 250 MHz, a value of approximately 19 dB. It is also recognizable that, as a fundamental principle, it is not possible to measure a DC component with this set-up and that the determination of very low-frequency components will involve a high degree of uncertainty. For this reason, these frequency components in the measured signals are artificially set to zero. For measurement in the time domain, a further input channel of the Agilent 54855A oscilloscope which was used (frequency range up to 6 GHz) was electrically connected with the calibration plane 14, permitting a direct measurement of the voltage $v_M(t)$ in the calibration plane for comparison with the voltage v(t) determined by means of the method according to the invention. Different signals are fed into the set-up at the first port 12 of the electric signal line 10 by means of different RF generators or signal generators 24. In each case the voltage v(t) and current i(t) in the calibration plane 14 are determined as described above using the method according to the invention and compared with the relevant direct measurement $v_M(t)$.

Figure 6:
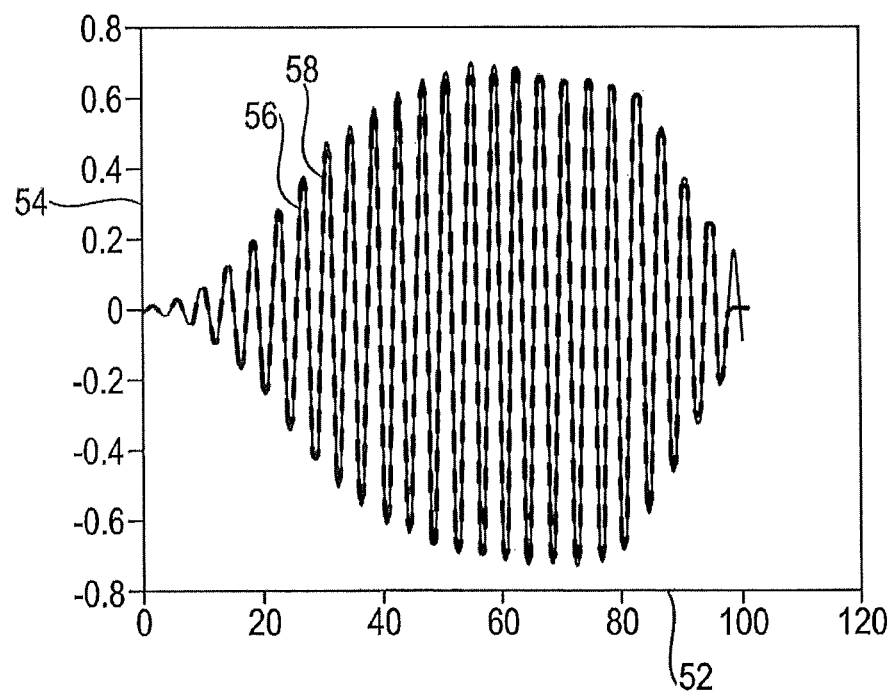
FIG. 6 shows a graphic representation of an electric voltage u(t) determined in the calibration plane using the method according to the invention and a direct measurement of the electric voltage $u_M(t)$ for an RF signal in the form of a pulse fed in at the first port.
Figure 7:
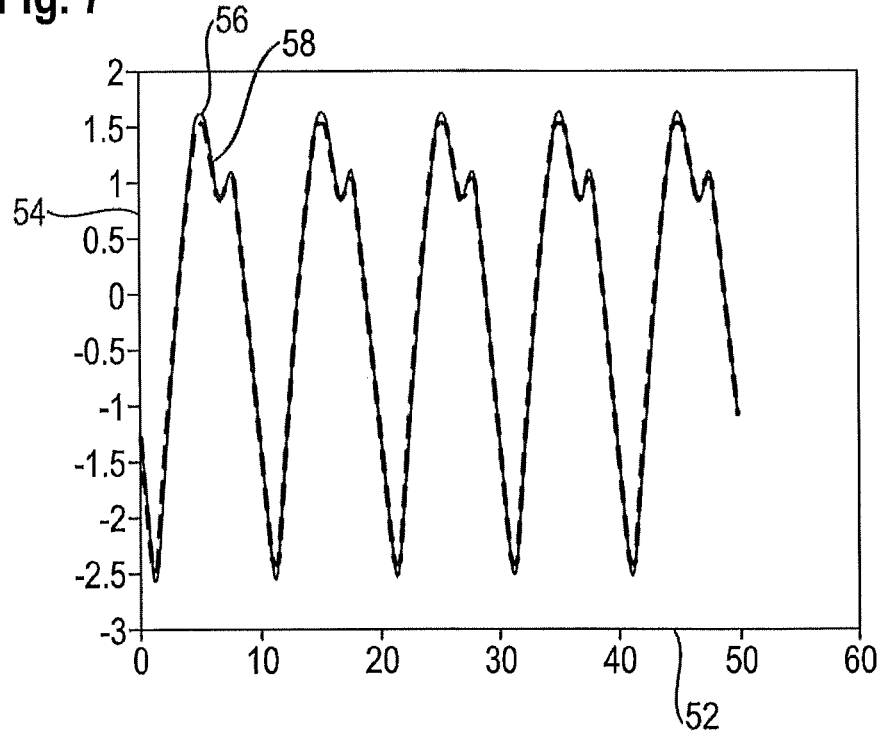
FIG. 7 shows a graphic representation of an electric voltage u(t) determined in the calibration plane using the method according to the invention and a direct measurement of the electric voltage $u_M(t)$ for an RF signal with harmonics fed in at the first port.
Figure 8:
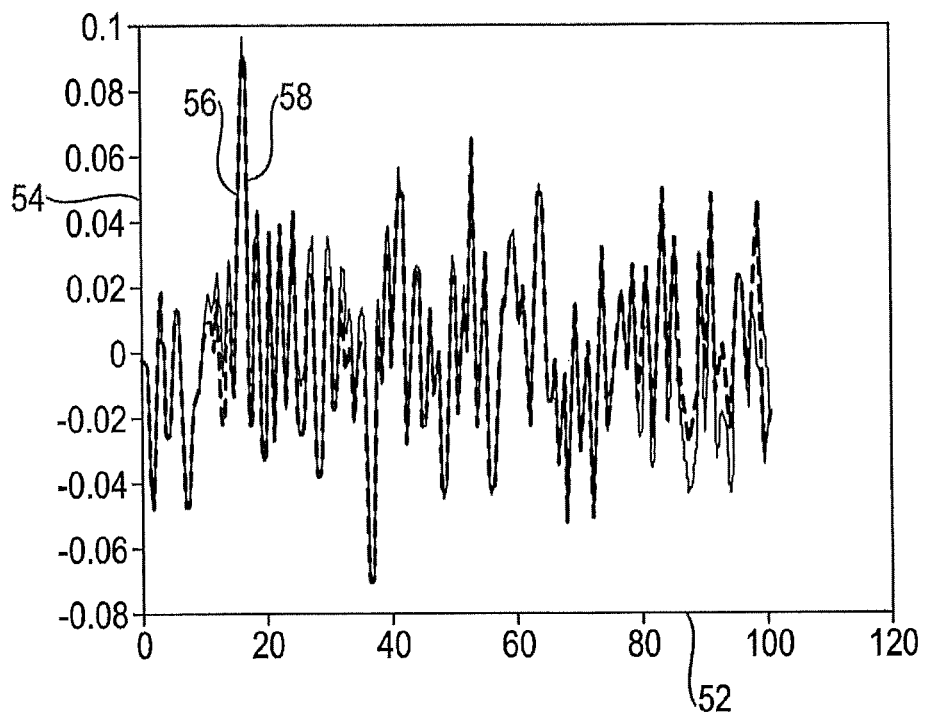
FIG. 8 shows a graphic representation of an electric voltage u(t) determined in the calibration plane using the method according to the invention and a direct measurement of the electric voltage $u_M(t)$ for an RF signal in the form of noise fed in at the first port.
Figure 9:
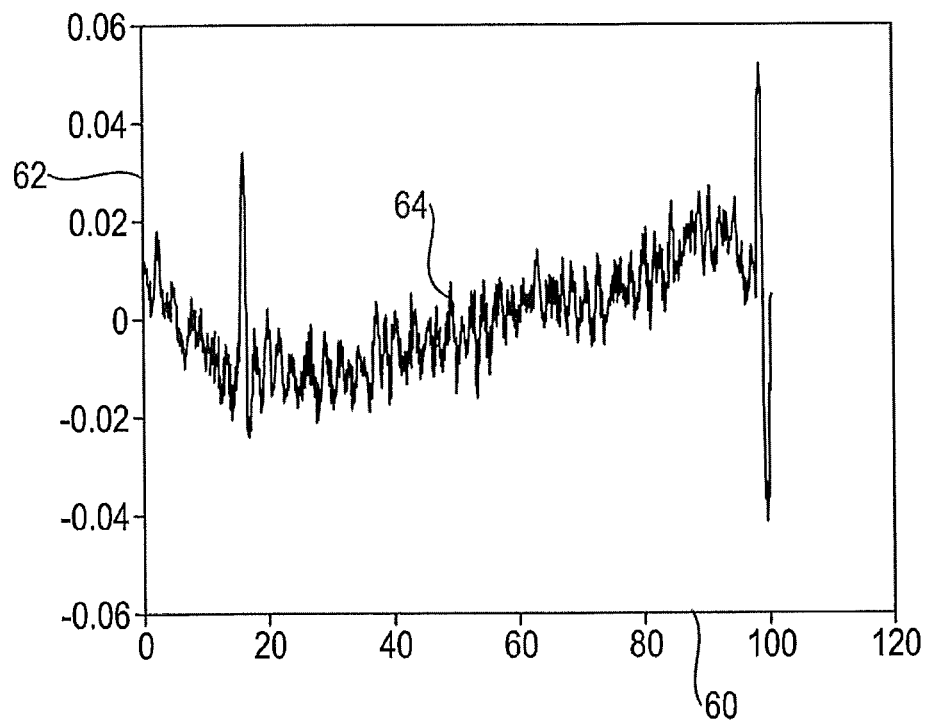
FIG. 9 shows a graphic representation of a difference in the electric voltage $\Delta U$ between the electric voltage u(t) determined using the method according to the invention and the direct measurement of the electric voltage $u_M(t)$ according to FIG. 8, i.e. for the RF signal in the form of noise fed in at the first port.

In FIGS. 6, 7 and 8, voltage curves v(t) determined using the method according to the invention are in each case compared with the direct measurement $v_M(t)$ as a reference. Of particular interest are test signals fed in at the first port 12 on the basis of the time domain measurement which do not consist simply of a mono frequency oscillation of constant amplitude. Specifically, the test signals used are a pulsed carrier (f=250 MHz), a signal with a high content of harmonics (fundamental frequency 100 MHz) and a noise signal.

In FIGS. 6 to 8, in each case a time t in ns (nanoseconds) is entered on a horizontal axis 52 and an electric voltage U in volts is entered on a vertical axis 54. A fifth graph 56 with a solid line illustrates the direct measured signal $v_M(t)$ of the electric voltage in the calibration plane 14 as a function of the time t and a sixth graph 58 with a broken line illustrates the signal v(t) of the electric voltage in the calibration plane 14 determined using the method according to the invention as a function of the time t. In FIG. 6, the pulsed carrier (f=250 MHz) was fed in at the first port 12 as test signal, in FIG. 7 the signal with a high content of harmonics (fundamental frequency 100 MHz) was fed in at the first port 12 as test signal and in FIG. 8 the noise signal was fed in at the first port 12 as test signal. Overall, the test results show that a very good correspondence exists between the voltage curves v(t) determined using the method according to the invention and the directly measured voltage curve $V_M(t)$.

The recognizable deviations between v(t) and $v_M(t)$ are explained in the following:

In FIG. 6, a deviation is recognizable between v(t) 58 and $v_M(t)$ 56 at the end of the time segment of the measured curve. This can be explained through the property of the FFT of considering input signals capable of being periodically continued. This property leads to possible errors at the beginning and at the end of the recorded signal, insofar as this is not periodically continued. This error can, for example, be circumvented through measurement of a longer time segment, combined with subsequent windowing.

The curves in FIG. 8 show a marked difference in places. This difference $\Delta U$ is represented graphically in FIG. 9, in which the time t in ns is entered on a horizontal axis 60 and a voltage difference $\Delta U$ in volts between the measured signal $v_M(t)$ 56 and the signal v(t) 58 determined using the method according to the invention is entered on a vertical axis 62. A seventh graph 64 illustrates the curve of the voltage difference $\Delta U(t)$ over time.

In addition to the already mentioned deviation at the end of the time segment and an error at t=16 ns, which is attributable to a brief overloading of the reference channel, the difference follows a sinusoidal curve with a periodicity of approximately 100 ns corresponding to f=10 MHz. It is to be assumed that the measurement at this frequency is subject to a comparatively large measuring error due to the very high coupling attenuation.

Figure 10:
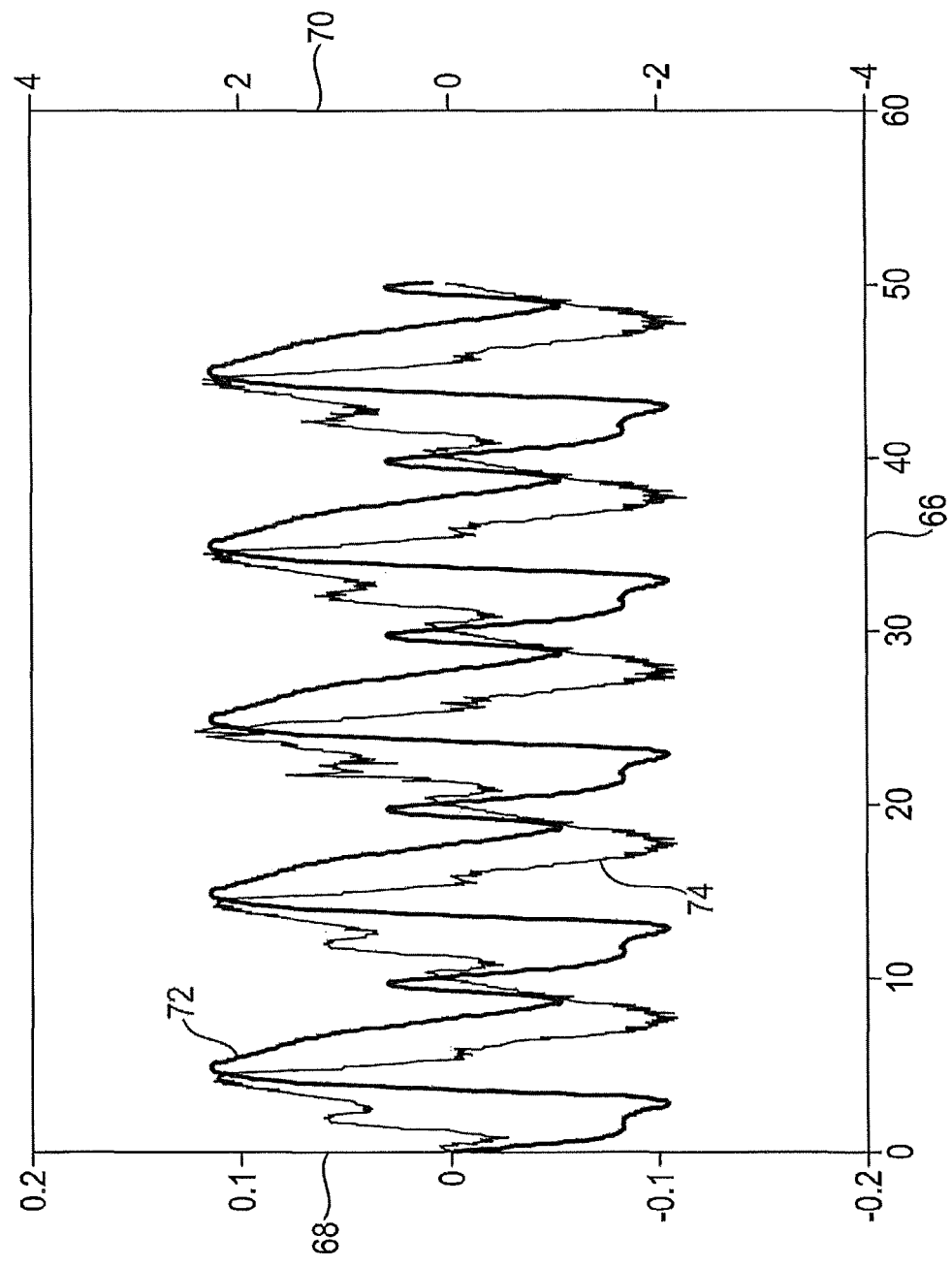
FIG. 10 shows a graphic representation of electric voltages $v_1(t)$ and $v_2(t)$ measured using the measuring set-up according to FIG. 4.

In FIG. 10, a time t in ns is entered on a horizontal axis 66, values for measured raw voltages $v_1$ at the first output 20 of the directional coupler 18 in volts are entered on a vertical axis 68 and values for measured raw voltages $v_2$ at the second output 22 of the directional coupler in volts are entered on a further vertical axis 70. An eighth graph 72 shows the curve of the raw voltage $v_1(t)$ over time and a ninth graph 74 shows the curve of the raw voltage $v_2(t)$ over time.

The raw voltages $v_1(t)$ 72 and $v_2(t)$ 74 are present at the inputs 36, 38 of the oscilloscope 34 in the case of the test signal containing harmonics (see FIG. 7). It can be seen that the frequency and phase response of the directional coupler 18 leads to a pronounced distortion of the signal. Using the described method according to the invention with the special combination of calibration, measuring and calculation, it is now possible to reconstruct the original signal v(t) 58 from the measured signals $v_1(t)$ 72 and $v_2(t)$ 74.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for determining electric voltage u(t) and/or electric current i(t) of an RF signal in the time domain in a calibration plane on an electrical conductor, said calibration plane having a device under test connected electrically in the calibration plane, wherein, via at least one directional coupler having two outputs and one signal input, a component of a first RF signal which runs within the at least one directional coupler from its signal input in the direction of the calibration plane and a component of a second RF signal which runs within the at least one directional coupler from the calibration plane in the direction of the signal input are coupled out, wherein a time-variable first signal value $v_1(t)$ of the component of the first RF signal is measured at a first output of the at least one directional coupler and a time-variable second signal value $v_2(t)$ of the component of the second RF signal is measured at a second output of the at least one directional coupler, wherein the at least one directional coupler is connected at its signal input with an input cable, said input cable having at its other end a first port, wherein, for a two-port error of the at least one directional coupler with an error matrix E $$E = \begin{pmatrix} e_{00} & e_{01} \\ e_{10} & e_{11} \end{pmatrix}$$

the error terms $e_{00}$, $e_{01}$, $e_{10}$ and $e_{11}$ are determined in a first step (calibration step) as a function of a frequency f and then, in a second step (measurement step), the time-variable first signal value $v_1(t)$ and the time-variable second signal value $v_2(t)$ are transformed, through a first mathematical operation, into the frequency domain as wave quantities $V_1(f)$ and $V_2(f)$, wherein absolute wave quantities $a_1$ and $b_1$ in the frequency domain in the calibration plane are calculated from the wave quantities $V_1(f)$ and $V_2(f)$ by means of the error terms $e_{00}$, $e_{01}$, $e_{10}$ and $e_{11}$, wherein the calculated absolute wave quantities $a_1$ and $b_1$ are converted by a second mathematical operation into the electric voltage u(t), the electric current i(t), or both, of the RF signal in the time domain in the calibration plane, such that, in order to determine the error terms $e_{00}$, $e_{01}$, $e_{10}$ and $e_{11}$, the first port (12), the signal input of the at least one directional coupler together with input cable, the first output of the at least one directional coupler and the second output of the at least one directional coupler are each electrically connected with a calibration device and, in order to measure the time-variable first signal value $v_1(t)$ and the time-variable second signal value $v_2(t)$, the signal input, the first output of the at least one directional coupler and the second output of the at least one directional coupler are isolated from the calibration device and electrically connected with a time domain measuring device, wherein a VNA (Vectorial Network Analyzer) with a first VNA port, a second VNA port and a third VNA port is used as calibration device, wherein a wave quantity $a_2$ of the component of the first RF signal coupled out via the first output of the at least one directional coupler is measured at the second VNA port electrically connected with the first output, and a wave quantity $b_2$ of the component of the second RF signal coupled out via the second output of the at least one directional coupler is measured at the third VNA port of the network analyzer electrically connected with the second output, wherein, for a two-port error between the first port of the input cable, which is connected with the first port of the VNA, and the calibration plane, with an error matrix I $$I = \begin{pmatrix} i_{00} & i_{01} \\ i_{10} & i_{11} \end{pmatrix}$$

the error terms $i_{00}$, $i_{01}$, $i_{10}$ and $i_{11}$ are determined and the error terms $e_{00}$, $e_{01}$, $e_{10}$ and $e_{11}$ are determined from these, whereby the error terms $e_{00}$, $e_{01}$, $e_{10}$ and $e_{11}$ and the error terms $i_{00}$, $i_{01}$, $i_{10}$ and $i_{11}$ are calculated from scattering parameters $S_{11,K}$, $S_{21,K}$, and $S_{31,K}/S_{21,K}$ of a scattering matrix S for the first port of the electric input cable leading to the signal input of the at least one directional coupler, the first output of the at least one directional coupler and the second output of the at least one directional coupler and a calibration standard K in each case electrically connected to the calibration plane, where K is represents a calibration standard of the type O (Open), S (Short), or M (Match), according to the formulas:

$$i_{00} = S_{11,M},$$

$$e_{00} = \frac{S_{31,M}}{S_{21,M}},$$

$$i_{10} \cdot i_{01} = \frac{(\Gamma_O - \Gamma_S)(S_{11,O} - S_{11,M})(S_{11,S} - S_{11,M})}{\Gamma_O \Gamma_S (S_{11,O} - S_{11,S})}$$

$$e_{10} \cdot e_{01} = \frac{(\Gamma_O - \Gamma_S)\left(\frac{S_{31,O}}{S_{21,O}} - \frac{S_{31,M}}{S_{21,M}}\right)\left(\frac{S_{31,S}}{S_{21,S}} - \frac{S_{31,M}}{S_{21,M}}\right)}{\Gamma_O \Gamma_S \left(\frac{S_{31,O}}{S_{21,O}} - \frac{S_{31,S}}{S_{21,S}}\right)}$$

$$i_{11} = \frac{\Gamma_S(S_{11,O} - S_{11,M}) - \Gamma_O(S_{11,S} - S_{11,M})}{\Gamma_O \Gamma_S (S_{11,O} - S_{11,S})}$$

-continued $$e_{11} = \frac{\Gamma_S\left(\frac{S_{31,O}}{S_{21,O}} - \frac{S_{31,M}}{S_{21,M}}\right) - \Gamma_O\left(\frac{S_{31,S}}{S_{21,S}} - \frac{S_{31,M}}{S_{21,M}}\right)}{\Gamma_O\Gamma_S\left(\frac{S_{31,O}}{S_{21,O}} - \frac{S_{31,S}}{S_{21,S}}\right)}$$

where $\Gamma_O$ is a known reflection factor of the Open calibration standard and $\Gamma_S$ is a known reflection factor of the Short calibration standard,
whereby the scattering parameters $S_{11,K}$, $S_{21,K}$, and $S_{31,K}/S_{21,K}$ are determined, according to the formulas $$S_{11,K} = \frac{b_0}{a_0}$$

$$S_{21,K} = \frac{a_2}{a_0}$$

$$\frac{S_{31,K}}{S_{21,K}} = \frac{b_2}{a_2}$$

from measurements, carried out with the VNA, of a wave quantity $a_0$ of the first RF signal at the first port, a wave quantity $b_0$ of the second RF signal at the first port, the wave quantity $a_2$ of the component of the first RF signal at the first output of the at least one directional coupler and the wave quantity $b_2$ of the component of the second RF signal at the second output of the at least one directional coupler, wherein in each case the calibration standard K is electrically connected to the calibration plane,
wherein the wave quantities $a_1$ and $b_1$ are determined according to the following formulas $$a_1 = \frac{e_{10}a_2}{1 - e_{11}\Gamma_{DUT}}$$

$$b_1 = \frac{b_2 - e_{00}a_2}{e_{01}}$$

where $$a_2 = \frac{V_1}{\sqrt{Z_1}}$$

$$b_2 = \frac{V_2}{\sqrt{Z_1}}$$

$$\Gamma_{DUT} = \frac{\frac{b_2}{a_2} - e_{00}}{e_{10} \cdot e_{01} + e_{11}\left(\frac{b_2}{a_2} - e_{00}\right)}.$$

$$e_{10} = i_{10} \cdot \frac{a_0}{a_2} \cdot \frac{1 - e_{11}\Gamma_{DUT}}{1 - i_{11}\Gamma_{DUT}}$$

where $\Gamma_{DUT}$ is the reflection factor of the device under test (DUT) connected to the calibration plane and $Z_1$ is the impedance at the first and second output of the at least one directional coupler.

2. The method of claim 1, wherein the signal values $v_1(t)$ and $v_2(t)$ are, respectively, an electric voltage or an electric current.

3. The method of claim 1, wherein the first mathematical operation is an FFT (Fast Fourier Transform) according to $$\{V_1(l \cdot \Delta f)\} = \text{FFT}\{v_1(k \cdot \Delta t)\}$$

$$\{V_2(l \cdot \Delta f)\} = \text{FFT}\{v_2(k \cdot \Delta t)\}$$

with k=0, 1, . . . , N−1
and =0, 1, . . . , (N−1)/2
where N is a number of data points, $\Delta f$ is a frequency increment expressed by $\Delta f = 2f_{max}/(N-1)$, $\Delta t$ is a time increment expressed by $\Delta t = 0.5/f_{max}$, and $f_{max}$ represents the maximum frequency for which calibration data are available, wherein the second mathematical operation is an inverse FFT (IFFT—Inverse Fast Fourier Transform) according to $$(u(k \cdot \Delta t)) = \text{IFFT}\{\sqrt{Z_0}(a_1(l \cdot \Delta f) + b_1(l \cdot \Delta f))\},$$

$$\{i(k \cdot \Delta t)\} = \text{IFFT}\{(\sqrt{Z_0})^{-1}(a_1(l \cdot \Delta f) - b_1(l \cdot \Delta f))\},$$

where $Z_0$ is an impedance in the calibration plane.

4. The method of claim 1 wherein an oscilloscope is used as time domain measuring device.

5. The method of claim 2, wherein the first mathematical operation is an FFT (Fast Fourier Transform) according to $$\{V_1(l \cdot \Delta f)\} = \text{FFT}\{v_1(k \cdot \Delta t)\}$$

$$\{V_2(l \cdot \Delta f)\} = \text{FFT}\{v_2(k \cdot \Delta t)\}$$

with k=0, 1, . . . , N−1
and l=0, 1, . . . , (N−1)/2
where N is a number of data points, where $\Delta f$ is a frequency increment, $\Delta f = 2f_{max}/(N-1)$, $\Delta t$ is a time increment where $\Delta t = 0.5/f_{max}$, and $f_{max}$ represents the maximum frequency for which calibration data are available, wherein the second mathematical operation is an inverse FFT (IFFT—Inverse Fast Fourier Transform) according to $$\{u(k \cdot \Delta t)\} = \text{IFFT}\{\sqrt{Z_0}(a_1(l \cdot \Delta f) + b_1(l \cdot \Delta f))\},$$

$$\{i(k \cdot \Delta t)\} = \text{IFFT}\{(\sqrt{Z_0})^{-1}(a_1(l \cdot \Delta f) - b_1(l \cdot \Delta f))\},$$

where $Z_0$ is an impedance in the calibration plane.

6. The method of claim 1 wherein an oscilloscope is used as time domain measuring device.

* * * * *

UNITED STATES PATENT AND TRADEMARK OFFICE
CERTIFICATE OF CORRECTION

PATENT NO. : 9,823,281 B2
APPLICATION NO. : 14/387882
DATED : November 21, 2017
INVENTOR(S) : Armbrecht et al.

Page 1 of 2

It is certified that error appears in the above-identified patent and that said Letters Patent is hereby corrected as shown below:

In the Specification

In Column 4 Line 27:
$$i_{11} = \frac{\Gamma_S (S_{11,O} - S_{11,M}) - \Gamma_O(S_{11,S} - S_{11,M})}{\Gamma_O \Gamma_S (S_{11,O} - S_{11,O})}$$
Should be:
$$i_{11} = \frac{\Gamma_S (S_{11,O} - S_{11,M}) - \Gamma_O(S_{11,S} - S_{11,M})}{\Gamma_O \Gamma_S (S_{11,O} - S_{11,S})}$$

In Column 7 Line 26:
$$i_{11} = \frac{\Gamma_S (S_{11,O} - S_{11,M}) - \Gamma_O(S_{11,S} - S_{11,M})}{\Gamma_O \Gamma_S (S_{11,O} - S_{11,O})}$$
Should be:
$$i_{11} = \frac{\Gamma_S (S_{11,O} - S_{11,M}) - \Gamma_O(S_{11,S} - S_{11,M})}{\Gamma_O \Gamma_S (S_{11,O} - S_{11,S})}$$

Column 12 Line 5:
$$e_{10} = i_0 \cdot \frac{a_0}{a_2} \cdot \frac{i - e_{11}\Gamma_{DUT}}{1 - i_{11}\Gamma_{DUT}}$$
Should be:
$$e_{10} = i_{10} \cdot \frac{a_0}{a_2} \cdot \frac{i - e_{11}\Gamma_{DUT}}{1 - i_{11}\Gamma_{DUT}}$$

In the Claims

Claim 3 Column 18 Line 16:
= 0, 1, ..., (N-1)/2
Should be:
L = 0, 1, ..., (N-1)/2

Signed and Sealed this
Twentieth Day of November, 2018

Andrei Iancu
*Director of the United States Patent and Trademark Office*

CERTIFICATE OF CORRECTION (continued)
U.S. Pat. No. 9,823,281 B2

Claim 3 Column 18 Line 24:

$$\left(u(k \cdot \Delta t)\right) = IFFT\left\{\sqrt{Z_0}\left(a_1(l \cdot \Delta f) + b_1(l \cdot \Delta f)\right)\right\}$$

Should be:

$$\{u(k \cdot \Delta t)\} = IFFT\left\{\sqrt{Z_0}\left(a_1(l \cdot \Delta f) + b_1(l \cdot \Delta f)\right)\right\}$$